United States Patent
Chua

(10) Patent No.: US 7,864,477 B1
(45) Date of Patent: Jan. 4, 2011

(54) CIRCUITS, ARCHITECTURES, APPARATUSES, SYSTEMS, ALGORITHMS AND METHODS AND SOFTWARE FOR AUTOMATIC GAIN CALIBRATION OF A BURST SIGNAL STREAM

(75) Inventor: Ah Siah Chua, Singapore (SG)

(73) Assignee: Marvell International Ltd., Hamilton (BM)

( * ) Notice: Subject to any disclaimer, the term of this patent is extended or adjusted under 35 U.S.C. 154(b) by 220 days.

(21) Appl. No.: 12/187,241

(22) Filed: Aug. 6, 2008

Related U.S. Application Data

(60) Provisional application No. 60/955,483, filed on Aug. 13, 2007.

(51) Int. Cl.
  *G11B 5/02* (2006.01)
(52) U.S. Cl. .......................................... 360/67; 360/46
(58) Field of Classification Search ........................ None
  See application file for complete search history.

(56) References Cited

U.S. PATENT DOCUMENTS

| | | | | |
|---|---|---|---|---|
| 3,879,674 A | * | 4/1975 | Dragon | 330/280 |
| 4,392,164 A | * | 7/1983 | Lequien | 360/77.08 |
| 5,319,508 A | * | 6/1994 | Tsunoda et al. | 360/77.08 |
| 5,805,022 A | * | 9/1998 | Bruccoleri et al. | 330/254 |
| 6,661,287 B2 | * | 12/2003 | Lin et al. | 330/254 |
| 7,054,088 B2 | * | 5/2006 | Yamazaki et al. | 360/65 |
| 7,110,199 B2 | * | 9/2006 | Sugawara et al. | 360/48 |
| 7,256,954 B2 | * | 8/2007 | Serizawa | 360/65 |

* cited by examiner

*Primary Examiner*—Jason C Olson

(57) ABSTRACT

Apparatuses, circuitry, architectures, systems, methods, algorithms and software for performing automatic gain calibration on an input signal. The apparatuses and/or circuits generally include an amplifier, a filter, a comparator, and a controller. The amplifier is configured to receive a gain level signal and to amplify the input signal in accordance with the gain level signal to produce an amplified signal. The filter is configured to filter the amplified signal to produce a filtered signal. The comparator is configured to compare the filtered output to a threshold value and to produce a comparison signal in response thereto. The controller is configured to iteratively reset the filter and adjust the gain level signal in response to the comparison signal to select a gain level. Embodiments of present invention advantageously provide for rapid automatic gain control, and are particularly advantageous for automatic gain control in systems adapted for input signals with bursting data and/or widely varying input amplitudes and/or in systems with a relatively large number of possible gain levels.

22 Claims, 7 Drawing Sheets

(Background)

CIRCUITS, ARCHITECTURES, APPARATUSES, SYSTEMS, ALGORITHMS AND METHODS AND SOFTWARE FOR AUTOMATIC GAIN CALIBRATION OF A BURST SIGNAL STREAM

RELATED APPLICATIONS

This application claims the benefit of U.S. Provisional Application No. 60/955,483, filed Aug. 13, 2007, the contents of which are incorporated herein by reference in its entirety.

FIELD OF THE INVENTION

The present invention generally relates to the field of automatic gain calibration (AGC). More specifically, embodiments of the present invention pertain to circuits, architectures, systems, methods, algorithms and software for AGC of a burst signal stream.

BACKGROUND

Magnetic storage systems, such as hard disk drives (HDDs), are used as mass storage in a wide variety of devices, including but not limited to personal computers, digital versatile disc (DVD) players, high definition television (HDTV) receivers, vehicle control systems, cellular or mobile telephones, television set top boxes, and portable media players. As these magnetic storage systems become smaller and/or attain higher data storage capacities, the density of data on the magnetic storage medium becomes higher.

A typical HDD includes magnetic storage media of one or more flat disks, called platters (sometimes also "disks" or "discs"). The platters are generally formed of two main substances: a substrate material that gives it structure and rigidity, and a magnetic media coating which holds the magnetic impulses (or moments) that represent data. A typical HDD further includes a read/write head, generally a magnetic transducer which can sense and/or change the magnetic fields stored on the platters. The read/write head is attached to a slider, generally an armature capable of placing the read/write head at a desired location over the platter.

Modern HDDs also include a variety of circuits for controlling the drive hardware, processing the signals read from and/or written to the disks, processing input and/or output from the drive, etc. A drive may have one or more integrated circuit devices or other devices to handle one or more of these operations. In many cases, a single HDD component such as a standardized and/or reusable integrated circuit device, combination of devices (e.g., a "chip set"), function block (e.g., an "IP core" which may be integrated into another integrated circuit device), etc., may be used in multiple different HDD designs. Thus, it is desirable for HDD components to be designed to accommodate a wide variety of operational specifications.

One common component in HDD designs is the preamplifier, which generally amplifies the signal from the read/write head(s) to a level usable by other HDD components (e.g., read channel components). The strength of the magnetic fields stored on magnetic storage media may vary widely. For example, as the density of data on a magnetic storage medium increases, the strength of the magnetic fields generally decrease, in order to minimize interference. Thus, the strength of the signal produced by the read/write head may also vary considerably depending on the size and/or capacity (and thus the areal density) of the magnetic storage medium. For example, the amplitude of data signals provided to a preamplifier in a HDD presently range from about 3 mV to about 30 mV. Because of the high variation in input signal, it is desirable for reusable preamplifiers and/or preamplifier components to be able to set the gain to an appropriate level such that the output signal is relatively constant, despite drive to drive variations in the strength of the input signal.

Automatic gain control (AGC) is typically performed at system startup (e.g., after an HDD is turned on and the disks have been "spun up" to a desired rotational velocity) to determine the appropriate gain level. FIG. 1 shows an exemplary input signal 100 that may be used to perform AGC. Input signal 100 includes signal bursts 101-107, separated by noise periods 111-116. In many HDD systems, the amplitude of noise in the system may be as much as $\frac{1}{3}^{rd}$ of the amplitude of the signal. Furthermore, signal bursts may comprise as little as 5% of the signal time. For example, while FIG. 1 is not drawn to scale, signal bursts 101-107 may each have a duration 130 of 4 µs, while the period from the start of one signal burst (e.g., signal burst 101) to the start of the next signal burst (e.g., signal burst 102) may be 80 µs.

It is desirable to minimize the amount of time required for AGC. In many systems, AGC is performed during a predetermined detection window. For example, in FIG. 1 detection window 120 has a duration of 500 µs. One known method for detecting the optimal gain setting is to perform a binary search by setting the gain to a first gain level for at least one signal burst and comparing the amplified signal to a desired or threshold level. However, in many cases no additional gating or timing signal is available to synchronize with the burst signals. Therefore each comparison window (e.g., comparison windows 121-123) may need to be long enough to cover at least two bursts in order to ensure that the window includes at least one complete burst. Thus, AGC detection window 120 only has enough time for three comparison windows 121-123. As a result, a binary search can only select from eight ($2^3$) possible gain levels.

In many cases, eight possible gain levels are insufficient to encompass the range of gain levels that may be used in modern magnetic storage systems. Therefore, it is desirable to provide automatic gain control in systems adapted for input signals with bursting data and/or widely varying input amplitudes and/or in systems with a relatively large number of possible gain levels, without increasing the duration of the AGC detection window.

SUMMARY

Embodiments of the present disclosure relate to apparatuses, circuitry, architectures, systems, methods, algorithms and software for performing automatic gain calibration on an input signal. The apparatuses and/or circuits generally include an amplifier, a filter, a comparator, and a controller. The amplifier is configured to receive a gain level signal and to amplify the input signal in accordance with the gain level signal to produce an amplified signal. The filter is configured to filter the amplified signal to produce a filtered signal. The comparator is configured to compare the filtered output to a threshold value and to produce a comparison signal in response thereto. The controller is configured to reset the filter and adjust the gain level signal in response to the comparison signal.

In some embodiments, the gain signal comprises a digital value corresponding to a gain setting. For example, the gain signal may be 3 bits, 4 bits, or larger. Thus, the gain signal may have one of 8 ($2^3$), 16 ($2^4$), or more values. Embodiments may be configured to obtain a preferred gain level by iteratively changing the gain level signal until the filtered signal remains below the threshold. In an exemplary embodiment, the filter may be configured to increase a value of the filtered signal in response to an amplitude of the amplified signal. For example, the controller may be configured to set the gain level signal to a first gain value in response to an AGC start signal, set the gain level signal to a new gain value in response to the comparison signal, and store a current value of the gain level signal in response to an AGC stop signal.

The filtered signal may, for example, comprise a DC value (e.g., a voltage across a capacitor). In a further embodiment, the filter comprises a rectifier configured to rectify the amplified signal, and may also include an accumulator configured to increase the filtered signal in response to an output of the rectifier.

The methods for automatic gain calibration of an input signal generally include steps of amplifying the input signal according to a gain level input to produce an amplified signal, filtering the amplified output to produce a filtered signal, and, adjusting the gain level signal and resetting the filter signal when the filter output exceeds a threshold value.

Exemplary embodiments of the method may include comparing the filtered signal to the threshold value to produce a comparison signal. In a further embodiment, the method includes adjusting the gain level signal and resetting the filter signal in response to the comparison signal. For example, the method may include setting the gain level signal to a first gain value in response to an AGC start signal, setting the gain level signal to a new gain value in response to the comparison signal, and storing a current value of the gain level signal in response to an AGC stop signal.

In another embodiment, filtering the amplified signal comprises changing a value of the filtered signal in response to an amplitude of the amplified signal. For example, the filtered signal may comprise a DC voltage and filtering the amplified signal may comprise charging a capacitor in response to an amplitude of the amplified signal (e.g., by applying the amplified signal or a derivative thereof to the capacitor).

In still another embodiment, the method includes repeating the adjusting of the gain level signal for a predetermined time interval and selecting a final gain level at the end of the interval. In one embodiment, for example, the predetermined time interval is approximately 500 µs. Embodiments of the present invention may be used to select a gain level from a relatively wide selection of gain intervals. As a result, embodiments of the present invention may be used in systems where the input signal may have a wide range of amplitudes. For example, in some embodiments the amplitude of the input signal may range from approximately 3 mV to 30 mV. In addition, embodiments may be used where the input signal includes bursts of data between periods of noise and/or no signal.

The architectures and/or systems generally comprise those that include a circuit embodying one or more of the inventive concepts disclosed herein. For example, embodiments of the apparatus and/or circuit may include preamplifiers and/or other control and/or signal processing circuits for a magnetic data storage system that include a circuit embodying one or more of the inventive concepts disclosed herein. The circuits may be implemented in one or more integrated circuit devices.

Embodiments of the present invention may also include, for example, hard disk drives including a preamplifier (e.g., a preamplifier including one or more circuits and/or devices and/or implementing one or more of the methods presented herein), a read/write head configured to produce the input signal as it passes over a magnetic storage medium, and/or a read-channel circuit configured to receive an output of the preamplifier circuit.

Embodiments of present invention advantageously provide for rapid automatic gain control. The embodiments are particularly advantageous for automatic gain control in systems adapted for input signals with bursting data and/or widely varying input amplitudes and/or in systems with a relatively large number of possible gain levels.

These and other advantages of the present invention will become readily apparent from the detailed description of embodiments below.

DETAILED DESCRIPTION

Figure 1:
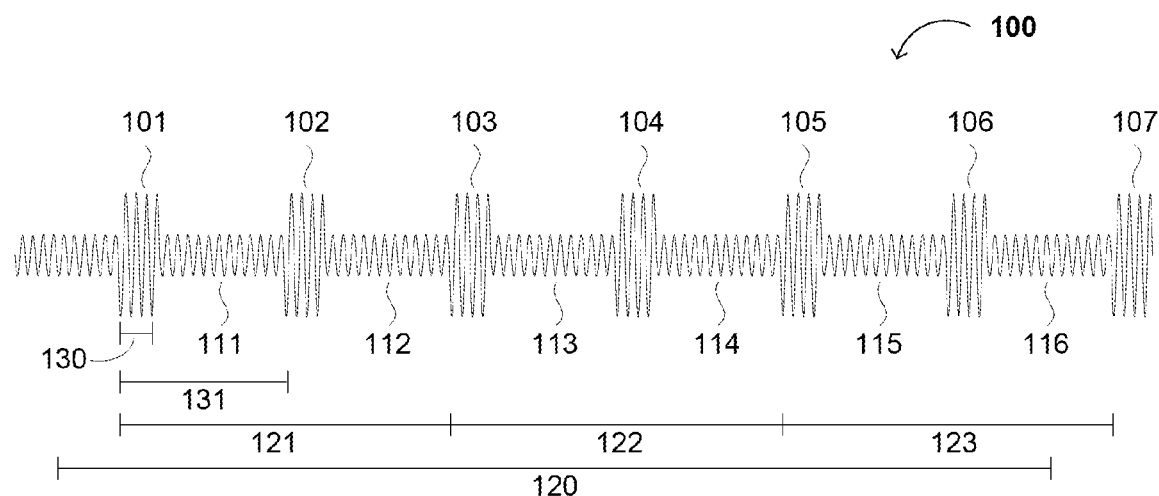
FIG. 1 is a graph showing an exemplary waveform for automatic gain control (AGC).

Reference will now be made in detail to embodiments of the invention, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the embodiments of the present invention, numerous specific details are set forth in order to provide a thorough understanding of the embodiments of the present invention. However, it will be readily apparent to one skilled in the art that the embodiments of the present invention may be practiced without these specific details. In other instances, well-known methods, procedures, components, and circuits have not been described in detail so as not to unnecessarily obscure aspects of the embodiments of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The invention, in its various aspects, will be explained in greater detail below with regard to exemplary embodiments.

An Exemplary Circuit

Figure 2:
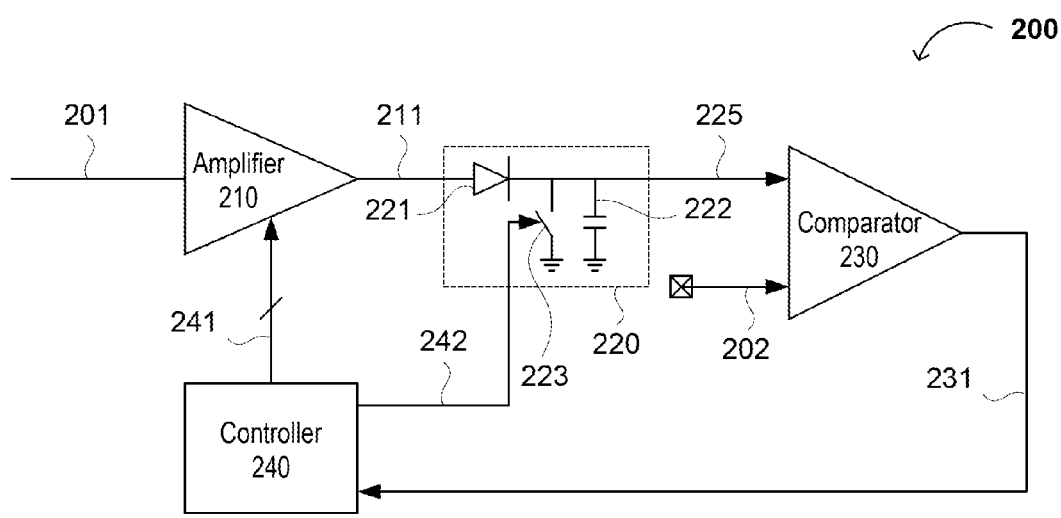
FIG. 2 is a diagram showing an exemplary embodiment of an AGC circuit.

FIG. 2 shows an exemplary AGC circuit 200. Circuit 200 includes an amplifier 210, a filter 220, a comparator 230, and a controller 240. Amplifier 210 is configured to receive a gain level signal 241 from controller 240 and to amplify the input signal 201 (e.g., a signal from a read/write had assembly in a hard disk drive or any other input signal) in accordance with the gain level signal 241 to produce an amplified signal 211. Filter 220 filters the amplified signal 211 to produce filtered signal 225. The comparator is configured to compare the filtered output to a threshold value 202 and to produce comparison signal 231. Controller 240 is configured to reset the filter 220 and adjust the gain level signal 241 in response to comparison signal 231.

Filter 220 may be configured to increase a value of filtered signal 225 in response to an amplitude of the amplified signal or a derivative thereof. In an exemplary embodiment, filter 220 may include a diode 221 to rectify amplified signal 211, thereby charging capacitor 222 in proportion to the amplitude of amplified signal 211. Thus, filtered output 225 may comprise a DC voltage (e.g., the voltage across capacitor 222). Comparator 230 may then compare the voltage of filtered signal 225 to the threshold value 202. Thus, comparator 230 may send a comparison signal 231 (e.g., as an edge, pulse, or other signal recognizable by controller 240) whenever the voltage of filtered signal 225 exceeds (or, depending on the implementation, falls below) threshold value 202.

Gain level signal 241 may comprise a digital value corresponding to a gain setting. For example, gain signal 241 may be 3 bits, 4 bits, or larger. Thus, the gain signal may have one of 8 ($2^3$), 16 ($2^4$), or more values. Controller 240 may be configured to obtain a preferred gain level by iteratively changing the gain level signal 241 until the filtered signal 225 remains below the value of threshold signal 202. For example, the controller may be configured to set the gain level signal 241 to a first gain value in response to an AGC start signal, set the gain level signal 241 to a new gain value in response to the comparison signal, and store a current value of the gain level signal 241 in response to an AGC stop signal.

Figure 3:
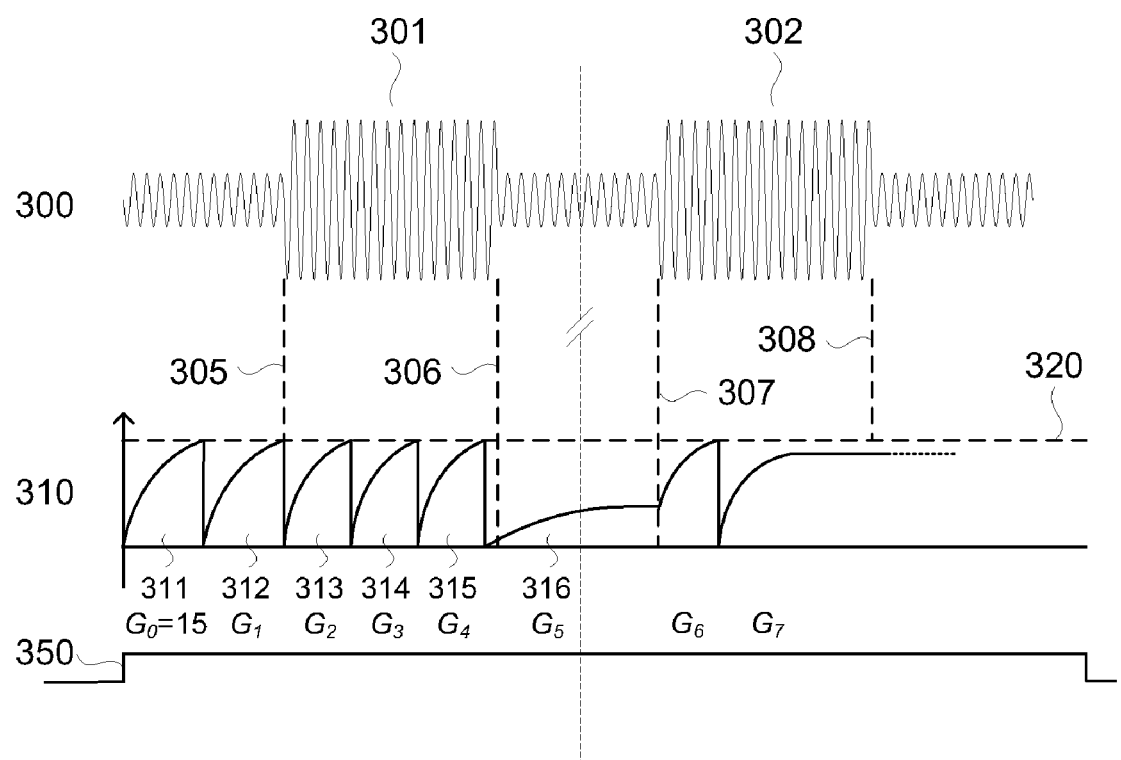
FIG. 3 is a graph of an exemplary input waveform and an exemplary filtered output signal.

Referring now to FIG. 3, exemplary waveforms during an AGC cycle are shown. Waveform 300 represents an exemplary input waveform having signal bursts 301 and 302. Waveform 310 represents an exemplary filtered output signal (e.g., signal 225). Waveform 350 represents an AGC control signal. Controller 240 of FIG. 2, for example, may be configured to perform AGC in response to the AGC control signal (e.g., to perform AGC while waveform 350 is "high"). During ramp-up period 311 of waveform 310, gain level signal 241 may be set to a first value $G_0$. In this exemplary embodiment, $G_0$ is the highest available gain setting. Thus, if gain level signal 241 is a 4-bit binary value, then $G_0=15$.

In this example, gain level $G_0$ causes the noise in waveform 300 to be amplified enough that the filtered output reaches threshold 320. As a result, controller 240 resets filtered output 225 (shown as waveform 310), and sets the gain level to a next-lower level $G_1$ (e.g., $G_1=14$). For example, controller 240 may reset filtered output 225 by closing switch 223 configured to receive a signal 242 from controller 240 to discharge capacitor 222. The cycle is repeated until the amplified pulses are no longer saturating the filter (e.g., the amplified pulses are not strong enough to push filtered output signal 310 above threshold 320). The filtered output 310 generally saturates more quickly during a signal pulse (e.g., ramp-up periods 313-315). Furthermore, at lower gain levels noise in waveform 300 will not saturate the filtered output (e.g., during ramp-up period 316 between signal pulses 301 and 32). Thus, when an AGC apparatus according to the present embodiments gets close to the desired gain level, the apparatus effectively waits for the next signal burst to resume the search for the desired gain level.

Referring again to FIG. 1, detection window 120 has a duration of 500 μs. In some AGC methods, a binary search may be performed by setting the gain to a first gain level for at least one signal burst and comparing the amplified signal to a desired or threshold level. However, in many cases no additional gating or timing signal is available to synchronize with the burst signals. Therefore each comparison window (e.g., comparison windows 121-123) may need to be long enough to cover at least two bursts in order to ensure that the window includes at least one complete burst. Thus, AGC detection window 120 only has enough time for three comparison windows 121-123. As a result, a binary search can only select from eight ($2^3$) possible gain levels. In contrast, the present embodiments do not need to divide the AGC window into smaller windows. The number of possible gain settings is generally limited only by the total duration of the signal bursts during the AGC window and by the ramping speed and/or sensitivity of the filter.

Embodiments of the apparatus and/or circuit may include preamplifiers and/or other control and/or signal processing circuits for a magnetic data storage system that include a circuit embodying one or more of the inventive concepts disclosed herein. The circuits may be implemented in one or more integrated circuit devices. It is well within the abilities of one skilled in the art to design and use logic and/or other circuit elements to implement the components and operations disclosed herein.

An Exemplary Method

Figure 4:
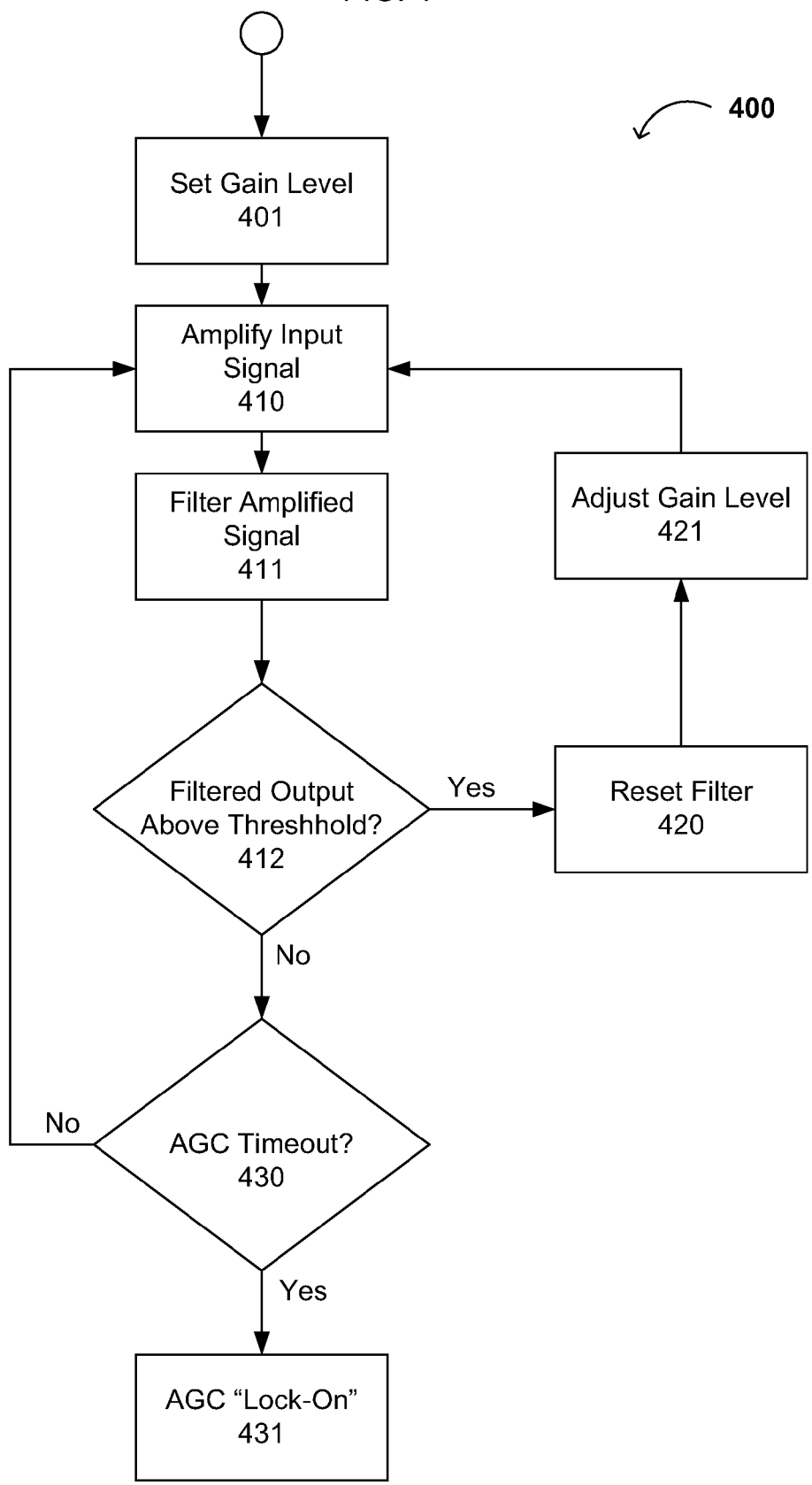
FIG. 4 is flowchart of an exemplary embodiment of a method for AGC.

FIG. 4 shows a flow chart of an exemplary method 400 for automatic gain calibration of an input signal. At step 401, a first gain level is set and at step 410 the input signal is amplified according to the gain level. At step 411, the amplified signal is filtered to produce a filtered signal. At step 412, the filtered signal is compared to the threshold value. If the filtered output is above the threshold, then the filtered output is rest at step 420 and the gain level is adjusted at step 421. Steps 410-412 are then repeated for the new gain level. While the filtered output remains below the threshold, steps 410-430 are repeated at the same gain level until step 430 determines that the AGC window is closed (e.g., at "AGC timeout"). When the AGC windows is closed, the AGC is locked on to the current gain level (e.g., the last gain level set in step 401 or step 421) at step 431.

Step 412 may include producing a comparison signal (e.g., comparison signal 231) in response to the comparison. Thus, step 420 may include resetting the filter signal in response to the comparison signal, and step 421 may include adjusting the gain level signal and resetting in response to the comparison signal. Furthermore, step 401 may include setting the gain level signal to a first gain value in response to an AGC start signal (e.g., in response to the rising edge of AGC control waveform 350), step 430 may include detecting an AGC end signal (e.g., the falling edge of AGC control waveform 350), and step 432 may include storing the current value of the gain level signal in response to the AGC stop signal.

In some embodiments, step 411 may include changing a value of the filtered signal in response to an amplitude of the amplified signal. For example, the filtered signal may comprise a DC voltage and filtering the amplified signal may comprise charging a capacitor in response to an amplitude of the amplified signal (e.g., by applying the amplified signal or a derivative thereof to the capacitor).

In an exemplary embodiment, the AGC window is approximately 500 µs. However, it will be recognized that longer or shorter AGC windows may be selected based on the expected characteristics of the calibration input signal. Embodiments of the present method may be used to select a gain level from a relatively wide selection of gain intervals. As a result, embodiments of the present invention may be used in systems where the input signal may have a wide range of amplitudes. For example, in some embodiments the amplitude of the input signal may range from approximately 3 mV to 30 mV. In addition, embodiments may be used where the input signal includes bursts of data between periods of noise and/or no signal (e.g., as described with respect to FIG. 3 herein).

Exemplary Software

Embodiments of the present invention also includes algorithms, computer program(s) and/or software, implementable and/or executable in a general purpose computer or workstation equipped with a conventional digital signal processor, configured to perform one or more steps of the method and/or one or more operations of the hardware. Thus, a further aspect of the invention relates to algorithms and/or software that implement the above method(s). For example, embodiments of the invention may further relate to a computer program, computer-readable medium, and/or waveform containing a set of instructions which, when executed by an appropriate processing device (e.g., a signal processing device, such as a microcontroller, microprocessor or DSP device), is configured to perform the above-described method and/or algorithm.

The computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

Embodiments of the present invention may also include computer-readable media having computer-executable instructions for forming circuits according to the present invention.

Such embodiments may include circuit descriptions, netlists, etc. Such embodiments may also include software and/or firmware for arranging existing circuit elements (e.g., components in a programmable gate array, programmable logic circuit/device or application-specific [integrated] circuit, etc.) in accordance with the circuits and/or operations described herein.

Exemplary Systems

Figure 5A:
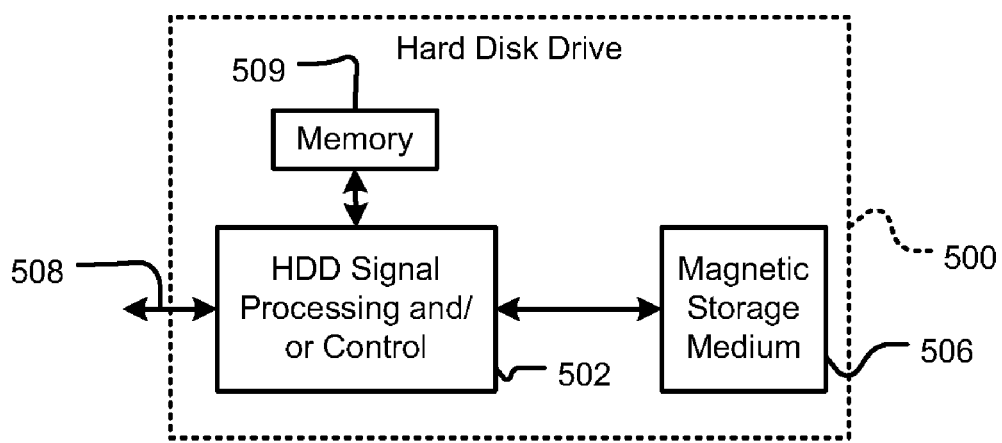
FIGS. 5A-5G are diagrams showing exemplary systems in which the present invention may be used.

Various exemplary implementations of the present invention are shown in FIGS. 5A-5G. Referring now to FIG. 5A, embodiments of the present invention can be implemented in a hard disk drive (HDD) 500. Embodiments of the present invention may implement either or both signal processing and/or control circuits, which are generally identified in FIG. 5A at 502. In some implementations, the signal processing and/or control circuit 502 and/or other circuits (not shown) in the HDD 500 may process data, perform coding and/or encryption, perform calculations, and/or format data that is output to and/or received from a magnetic storage medium 506.

The HDD 500 may communicate with a host device (not shown) such as a computer, mobile computing devices such as personal digital assistants, cellular phones, media or MP3 players and the like, and/or other devices via one or more wired or wireless communication links 508. The HDD 500 may be connected to memory 509 such as random access memory (RAM), nonvolatile memory such as flash memory, read only memory (ROM) and/or other suitable electronic data storage.

Figure 5B:
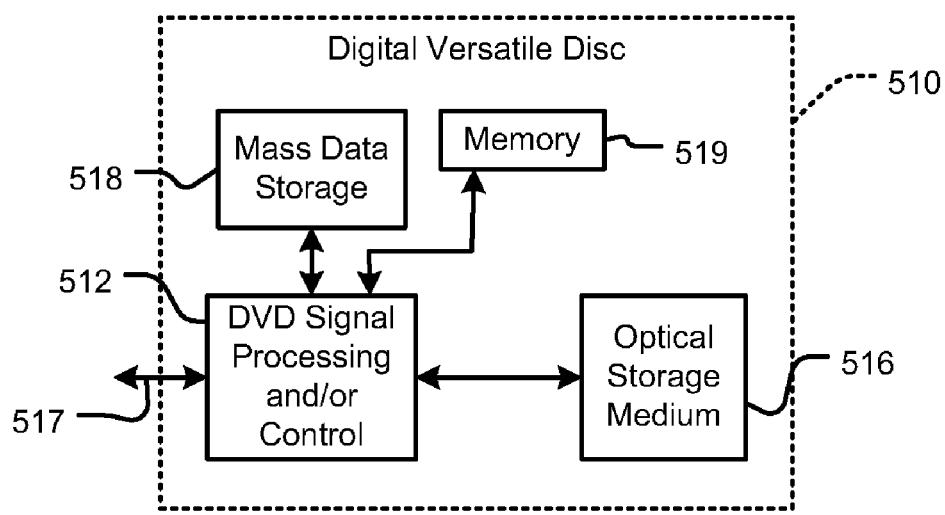

Referring now to FIG. 5B, embodiments of the present invention can be implemented in a digital versatile disc (DVD) drive 510. Embodiments of the present invention may implement either or both signal processing and/or control circuits, which are generally identified in FIG. 5B at 512, and/or mass data storage of the DVD drive 510. The signal processing and/or control circuit 512 and/or other circuits (not shown) in the DVD 510 may process data, perform coding and/or encryption, perform calculations, and/or format data that is read from and/or data written to an optical storage medium 516. In some implementations, the signal processing and/or control circuit 512 and/or other circuits (not shown) in the DVD 510 can also perform other functions such as encoding and/or decoding and/or any other signal processing functions associated with a DVD drive.

The DVD drive 510 may communicate with an output device (not shown) such as a computer, television or other device via one or more wired or wireless communication links 517. The DVD 510 may communicate with mass data storage 518 that stores data in a nonvolatile manner. The mass data storage 518 may include a hard disk drive (HDD). The HDD may have the configuration shown in FIG. 5A. The HDD may be a mini HDD that includes one or more platters having a diameter that is smaller than approximately 1.8". The DVD 510 may be connected to memory 519 such as RAM, ROM, nonvolatile memory such as flash memory and/or other suitable electronic data storage.

Figure 5C:
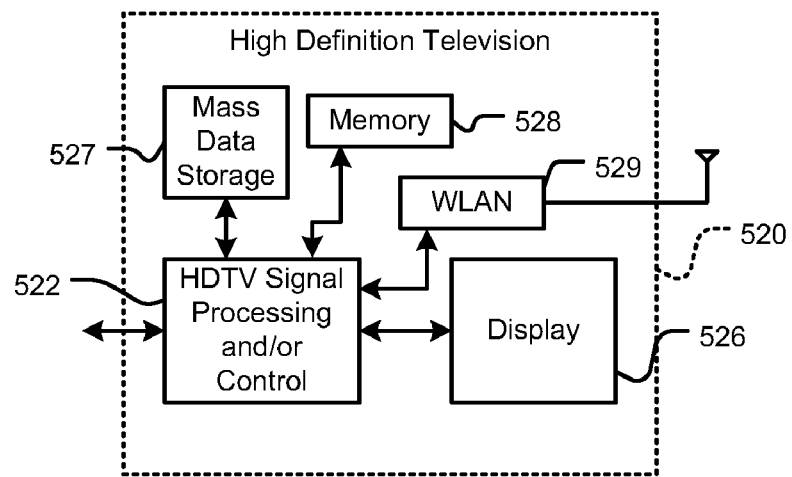

Referring now to FIG. 5C, embodiments of the present invention can be implemented in a high definition television (HDTV) 520. Embodiments of the present invention may implement either or both signal processing and/or control circuits, which are generally identified in FIG. 5E at 522, a WLAN interface, and/or mass data storage of the HDTV 520. The HDTV 520 receives HDTV input signals in either a wired or wireless format and generates HDTV output signals for a display 526. In some implementations, signal processing circuit and/or control circuit 522 and/or other circuits (not shown) of the HDTV 520 may process data, perform coding and/or encryption, perform calculations, format data and/or perform any other type of HDTV processing that may be required.

The HDTV 520 may communicate with mass data storage 527 that stores data in a nonvolatile manner such as optical and/or magnetic storage devices. At least one HDD may have the configuration shown in FIG. 5A and/or at least one DVD may have the configuration shown in FIG. 5B. The HDD may be a mini HDD that includes one or more platters having a diameter that is smaller than approximately 1.8". The HDTV 520 may be connected to memory 528 such as RAM, ROM, nonvolatile memory such as flash memory and/or other suitable electronic data storage. The HDTV 520 also may support connections with a WLAN via a WLAN network interface 529.

Figure 5D:
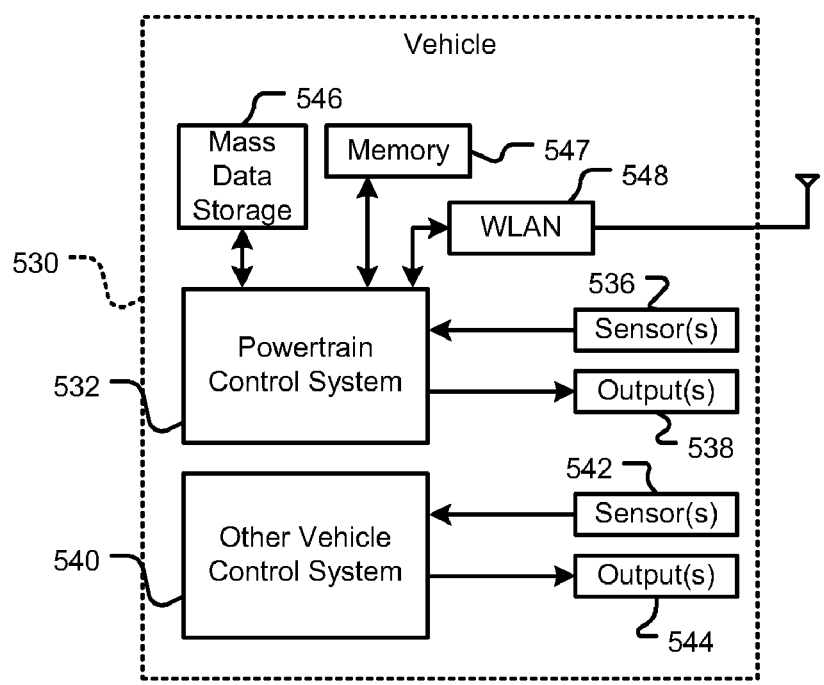

Referring now to FIG. 5D, embodiments of the present invention may implement a control system of a vehicle 530, a WLAN interface, and/or mass data storage of the vehicle control system. In some implementations, embodiments of the present invention implement a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

Embodiments of the present invention may also be implemented in other control systems 540 of the vehicle 530. The control system 540 may likewise receive signals from input sensors 542 and/or output control signals to one or more output devices 544. In some implementations, the control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 532 may communicate with mass data storage 546 that stores data in a nonvolatile manner. The mass data storage 546 may include optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The powertrain control system 532 may be connected to memory 547 such as RAM, ROM, nonvolatile memory such as flash memory and/or other suitable electronic data storage. The powertrain control system 532 also may support connections with a WLAN via a WLAN network interface 548. The control system 540 may also include mass data storage, memory and/or a WLAN interface (all not shown).

Figure 5E:
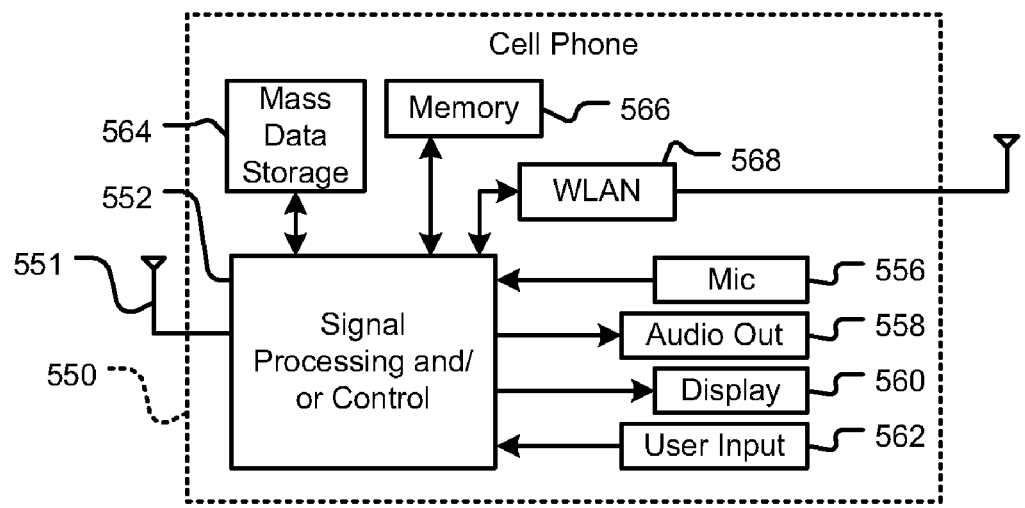

Referring now to FIG. 5E, embodiments of the present invention can be implemented in a cellular phone 550 that may include a cellular antenna 551. Embodiments of the present invention may implement either or both signal processing and/or control circuits, which are generally identified in FIG. 5E at 552, a WLAN interface and/or mass data storage of the cellular phone 550. In some implementations, the cellular phone 550 includes a microphone 556, an audio output 558 such as a speaker and/or audio output jack, a display 560 and/or an input device 562 such as a keypad, pointing device, voice actuation and/or other input device. The signal processing and/or control circuits 552 and/or other circuits (not shown) in the cellular phone 550 may process data, perform coding and/or encryption, perform calculations, format data and/or perform other cellular phone functions.

The cellular phone 550 may communicate with mass data storage 564 that stores data in a nonvolatile manner such as optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The cellular phone 550 may be connected to memory 566 such as RAM, ROM, nonvolatile memory such as flash memory and/or other suitable electronic data storage. The cellular phone 550 also may support connections with a WLAN via a WLAN network interface 568.

Figure 5F:
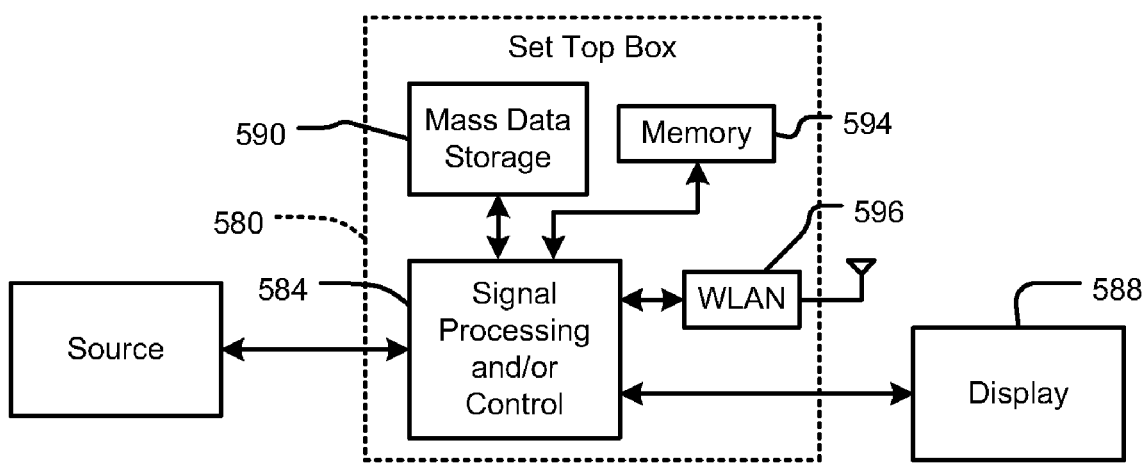
Figure 5G:
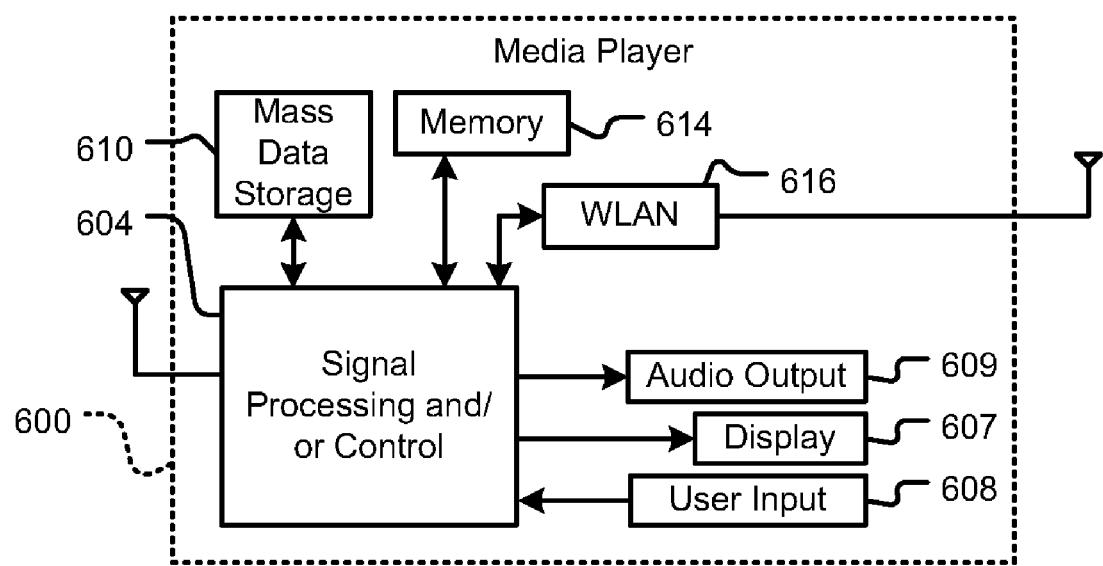

Referring now to FIG. 5F, embodiments of the present invention can be implemented in a set top box 580. Embodiments of the present invention may implement either or both signal processing and/or control circuits, which are generally identified in FIG. 5F at 584, a WLAN interface and/or mass data storage of the set top box 580. The set top box 580 receives signals from a source such as a broadband source and outputs standard and/or high definition audio/video signals suitable for a display 588 such as a television and/or monitor and/or other video and/or audio output devices. The signal processing and/or control circuits 584 and/or other circuits (not shown) of the set top box 580 may process data, perform coding and/or encryption, perform calculations, format data and/or perform any other set top box function.

The set top box 580 may communicate with mass data storage 590 that stores data in a nonvolatile manner. The mass data storage 590 may include optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The set top box 580 may be connected to memory 594 such as RAM, ROM, nonvolatile memory such as flash memory and/or other suitable electronic data storage. The set top box 580 also may support connections with a WLAN via a WLAN network interface 596.

Referring now to FIG. 5F, embodiments of the present invention can be implemented in a media player 500. Embodiments of the present invention may implement either or both signal processing and/or control circuits, which are generally identified in FIG. 5G at 504, a WLAN interface and/or mass data storage of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 5A and/or at least one DVD may have the configuration shown in FIG. 5B. The HDD may be a mini HDD that includes one or more platters having a diameter that is smaller than approximately 1.8". The media player 500 may be connected to memory 514 such as RAM, ROM, nonvolatile memory such as flash memory and/or other suitable electronic data storage. The media player 500 also may support connections with a WLAN via a WLAN network interface 516. Still other implementations in addition to those described above are contemplated.

CONCLUSION/SUMMARY

Thus, embodiments of the present invention provide apparatuses, circuitry, architectures, systems, methods, algorithms and software for performing automatic gain calibration on an input signal. Embodiments of present invention advantageously provide for rapid automatic gain control, and are particularly advantageous for automatic gain control in systems adapted for input signals with bursting data and/or widely varying input amplitudes and/or in systems with a relatively large number of possible gain levels.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for automatic gain calibration of an input signal, comprising the steps of:
    amplifying said input signal according to a gain level signal to produce an amplified signal;
    filtering said amplified output to produce a filtered signal;
    comparing said filtered signal to a threshold value to produce a comparison signal; and
    producing said gain level signal and resetting said filtered signal in response to said comparison signal.

2. The method of claim 1, further comprising:
    setting said gain level signal to a first gain value in response to an AGC start signal;
    setting said gain level signal to a new gain value in response to said comparison signal; and
    storing a current value of said gain level signal in response to an AGC stop signal.

3. The method of claim 1, wherein filtering said amplified signal comprises changing a value of said filtered signal in response to an amplitude of said amplified signal.

4. The method of claim 1, wherein said filtered signal comprises a DC voltage and filtering said amplified signal comprises increasing said DC voltage in response to an amplitude of said amplified signal.

5. A method for automatic gain calibration of an input signal comprising:
    performing the method of claim 1 for a predetermined time interval; and
    selecting a final gain level at an end-point of said interval.

6. The method of claim 5, wherein said predetermined time interval is approximately 500 μs.

7. The method of claim 1, wherein said input signal comprises bursts of data, said bursts of data having amplitudes of from approximately 3 mV to 30 mV.

8. An apparatus for performing automatic gain calibration on an input signal, said apparatus comprising:
    an amplifier configured to receive a gain level signal and to amplify said input signal in accordance with said gain level signal to produce an amplified signal;
    a filter configured to filter said amplified signal to produce a filtered signal;
    a comparator configured to compare said filtered output to a threshold value and to produce a comparison signal in response thereto; and
    a controller configured to reset said filter and adjust said gain level signal in response to said comparison signal.

9. The apparatus of claim 8, wherein said gain signal comprises a digital value corresponding to a gain setting.

10. The apparatus of claim 8, wherein said gain signal corresponds to one of at least sixteen gain settings.

11. The apparatus of claim 8, wherein said filter is further configured to increase a value of said filtered signal in response to an amplitude of said amplified signal.

12. The apparatus of claim 8, wherein said filtered signal comprises a DC value.

13. The apparatus of claim 12, wherein said filter comprises a rectifier configured to rectify said amplified signal.

14. The apparatus of claim 13, wherein said filter further comprises an accumulator configured to increase said filtered signal in response to an output of said rectifier.

15. The apparatus of claim 8, wherein said controller is further configured to:
    set said gain level signal to a first gain value in response to an AGC start signal;
    set said gain level signal to a new gain value in response to said comparison signal; and
    store a current value of said gain level signal in response to an AGC stop signal.

16. The apparatus of claim 8, wherein said input signal comprises an output of a read/write head in a magnetic data storage system.

17. A preamplifier for a magnetic data storage system comprising the apparatus of claim 8.

18. An automatic gain control (AGC) circuit comprising
    an amplifier circuit configured to receive a gain level signal and to amplify said input signal in accordance with said gain level signal to produce an amplified signal;

a filter circuit configured to filter said amplified signal to produce a filtered signal;

a comparison circuit configured to compare said filtered output to a threshold value and to produce a comparison signal in response thereto; and a controller circuit configured to reset said filter and adjust said gain level signal in response to said comparison signal.

19. A preamplifier circuit comprising the AGC circuit of claim 18.

20. An integrated circuit device comprising the preamplifier circuit of claim 19.

21. A hard disk drive comprising:

the preamplifier circuit of claim 19;

a read/write head configured to produce said input signal; and a read-channel circuit configured to receive an output of said preamplifier circuit.

22. The hard disk drive of claim 21, wherein said preamplifier is configured to amplify said output of said read/write head in response to a gain level output of said AGC circuit.

* * * * *